US008828810B2

(12) United States Patent
Schulze et al.

(10) Patent No.: US 8,828,810 B2
(45) Date of Patent: Sep. 9, 2014

(54) METHOD OF PRODUCING A SEMICONDUCTOR INCLUDING TWO DIFFERENTLY DOPED SEMICONDUCTOR ZONES

(75) Inventors: Hans-Joachim Schulze, Taufkirchen (DE); Manfred Pfaffenlehner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 154 days.

(21) Appl. No.: 13/448,748

(22) Filed: Apr. 17, 2012

(65) Prior Publication Data
US 2012/0202332 A1 Aug. 9, 2012

Related U.S. Application Data

(62) Division of application No. 12/241,910, filed on Sep. 30, 2008, now Pat. No. 8,159,022.

(51) Int. Cl.
| | | |
|---|---|---|
| H01L 21/00 | (2006.01) | |
| H01L 29/06 | (2006.01) | |
| H01L 29/66 | (2006.01) | |
| H01L 29/10 | (2006.01) | |
| H01L 29/739 | (2006.01) | |
| H01L 29/417 | (2006.01) | |

(52) U.S. Cl.
CPC ........ *H01L 29/7395* (2013.01); *H01L 29/0619* (2013.01); *H01L 29/66333* (2013.01); *H01L 29/1095* (2013.01); *H01L 29/41766* (2013.01); *H01L 29/0615* (2013.01)
USPC .................... 438/151; 438/197; 257/E29.027

(58) Field of Classification Search
USPC .................. 257/327–329, 335, 341, E29.027, 257/E29.028, E29.066, E29.067, E29.198, 257/E29.201, E29.256, E29.257; 438/309, 438/133, 151
See application file for complete search history.

(56) References Cited

U.S. PATENT DOCUMENTS

| | | |
|---|---|---|
| 6,309,920 B1 | 10/2001 | Laska et al. |
| 6,441,408 B2 | 8/2002 | Porst et al. |

(Continued)

FOREIGN PATENT DOCUMENTS

| | | |
|---|---|---|
| DE | 103 30 571 | 2/2005 |
| DE | 10 2004 039 209 | 2/2006 |

(Continued)

OTHER PUBLICATIONS

Biermann, et al., "New 3300V High Power Emcon-HDR Diode with High Dynamic Robustness",2003, pp. 1-6.

(Continued)

*Primary Examiner* — Selim Ahmed
(74) *Attorney, Agent, or Firm* — Dicke, Billig & Czaja, PLLC

(57) ABSTRACT

A method for producing a semiconductor component structure in a semiconductor body. In one embodiment, the method includes producing two differently doped semiconductor zones of the same conduction type, and carrying out a first implantation, implanting dopant atoms of a first conduction type into the semiconductor body via one of the sides over the whole area. A mask is produced on the one side, partly leaving free the one side. A second implantation is carried out, implanting dopant atoms of the first conduction type into the region left free by the mask proceeding from the one of the sides.

9 Claims, 6 Drawing Sheets

(56) References Cited

U.S. PATENT DOCUMENTS

| | | |
|---|---|---|
| 7,233,031 B2 | 6/2007 | Mauder et al. |
| 7,470,952 B2 | 12/2008 | Ruething et al. |
| 7,491,629 B2 | 2/2009 | Schulze |
| 7,812,427 B2 | 10/2010 | Mauder et al. |
| 7,973,363 B2 | 7/2011 | Hara |
| 2005/0035405 A1 | 2/2005 | Mauder et al. |
| 2006/0244060 A1 | 11/2006 | Kapels et al. |
| 2007/0120181 A1* | 5/2007 | Ruething et al. ............ 257/328 |
| 2007/0278472 A1 | 12/2007 | Mauder et al. |

FOREIGN PATENT DOCUMENTS

| | | |
|---|---|---|
| DE | 10 2005 053 487 | 5/2007 |
| DE | 10 2006 025 958 | 10/2007 |
| JP | 6115370 | 1/1986 |
| JP | 6021358 | 1/1994 |
| JP | 8316480 | 11/1996 |
| JP | 2001144096 | 5/2001 |
| JP | 2002520885 | 7/2002 |
| JP | 2004-363328 | 12/2004 |
| JP | 2005136092 | 5/2005 |
| JP | 2007134714 | 5/2007 |
| JP | 2009117634 | 5/2009 |
| JP | 2009194330 | 8/2009 |

OTHER PUBLICATIONS

Non-Final Office Action mailed Apr. 5, 2010 in U.S. Appl. No. 12/241,910.

Non-Final Office Action mailed Jul. 5, 2011 in U.S. Appl. No. 12/241,910.

* cited by examiner

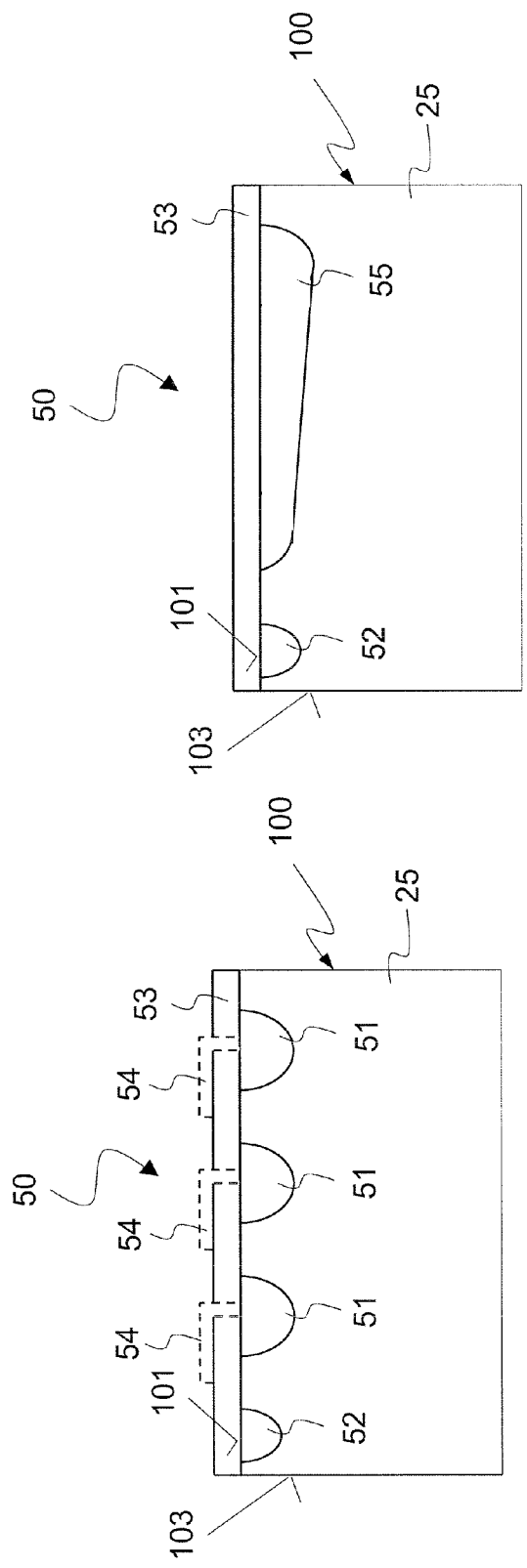

METHOD OF PRODUCING A SEMICONDUCTOR INCLUDING TWO DIFFERENTLY DOPED SEMICONDUCTOR ZONES

CROSS-REFERENCE TO RELATED APPLICATIONS

This Utility Patent Application is a divisional application of U.S. application Ser. No. 12/241,910, filed Sep. 30, 2008, which is incorporated herein by reference.

BACKGROUND

Bipolar power semiconductor components such as power IGBTs or power diodes, for example, have a—usually lightly doped—base zone that forms a pn junction with a further semiconductor zone. The component is turned off if the pn junction is reverse-biased by the application of a reverse voltage. In this case, there forms in the base zone a space charge zone which, proceeding from the pn junction, extends into the base zone all the further, the higher the reverse voltage present and the lower the doping of the base zone.

Such power semiconductor components are intended to have a high dynamic robustness, that is to say are intended to be able to turn off even high currents rapidly and reliably. They are intended to have a high static dielectric strength. The are intended also to be able to carry an avalanche current after an avalanche breakdown has occurred, without being destroyed in the process.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates one embodiment of an edge termination in the region of the edge zone.

FIG. 4 illustrates one embodiment of an edge termination in the region of the edge zone.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
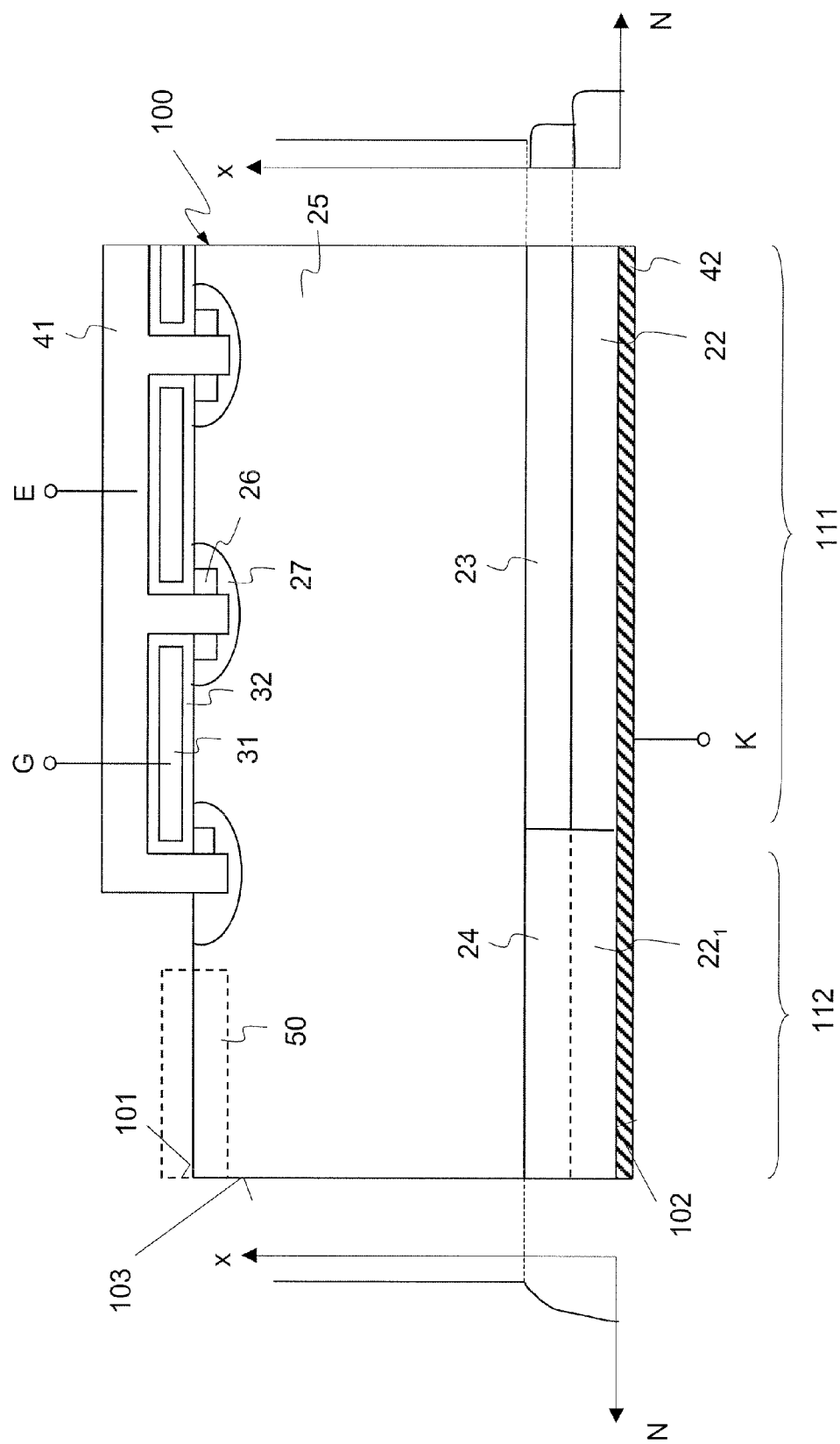
FIG. 1 illustrates one embodiment of a power IGBT including a semiconductor body having an inner zone and an edge zone, on the basis of a cross section through the semiconductor body.

FIG. 1 illustrates one embodiment of a power IGBT on the basis of a vertical cross-sectional illustration. This power IGBT includes a semiconductor body 100 having a first side 101, which is referred to hereinafter as front side, and a second side 102, which is referred to hereinafter as rear side. The front and rear sides 101, 102 delimit the semiconductor body 100 in a vertical direction. In a lateral direction, semiconductor body is delimited by an edge 103 which, in the example illustrated, runs perpendicular to the front and rear sides 101, 102, but which can also run in bevelled fashion relative to the front side 101 and/or the rear side 102 (not illustrated).

The semiconductor body 100 has an edge zone 112 which adjoins the edge 103 in a lateral direction of the semiconductor body 100 and which is adjacent to the inner zone 111 of the semiconductor body 100 in a lateral direction at a sides opposite the edge 103. In a plane running perpendicular to the sectional plane illustrated in FIG. 1, the edge zone 112 surrounds the inner zone 111 completely. The semiconductor body 100 can have the geometry of a circular disk, and the edge 103 and the edge zone 112 then have an annular geometry. Furthermore, the semiconductor body 100 can also have any other disk-shaped geometry, for example a rectangular-disk-shaped geometry.

The IGBT has a base zone 25 of a first conduction type, the base zone extending in a lateral direction of the semiconductor body over the inner zone 111 and the edge zone 112. The base zone 25 is an n-doped semiconductor zone if the IGBT is an n-channel IGBT and a p-doped semiconductor zone if the IGBT is a p-channel IGBT. A doping concentration of the base zone 25 lies for example within the range of between $10^{12}$ cm$^{-3}$ and $10^{15}$ cm$^3$, and can lie in particular between $10^{13}$ cm$^{-3}$ and $10^{14}$ cm$^{-3}$. The doping of the base zone 25 results for example from a basic doping which the semiconductor body 100 has before further semiconductor zones—which will be explained below—of the IGBT are produced.

In the inner zone 111, the IGBT has a transistor cell array having a plurality of transistor cells constructed such that they are of the same type in each case. Each of the transistor cells has a source zone 26 of the first conduction type, the source zone also being referred to as emitter zone, and a body zone 27 of a second conduction type, which is complementary to the first conduction type, the body zone being arranged between the source zone 26 and the base zone 25. A gate electrode 31 is present for controlling a conducting channel in the body zone 27 between the source zone 26 and the base zone 25, the gate electrode being dielectrically insulated from the semiconductor body 100 by a gate dielectric 32 and being arranged adjacent to the body zone 27. The gate electrode 31 is common to all the transistor cells and is realized as a planar gate electrode arranged above the front side 101 of the semiconductor body in the example illustrated. Contact is made with the source zones 26 of the individual transistor cells by a first connection electrode 41, which short-circuits the source zones 26 and the body zones 27 in the example illustrated and which forms a source connection or a first emitter connection E of the power IGBT.

Figure 2:
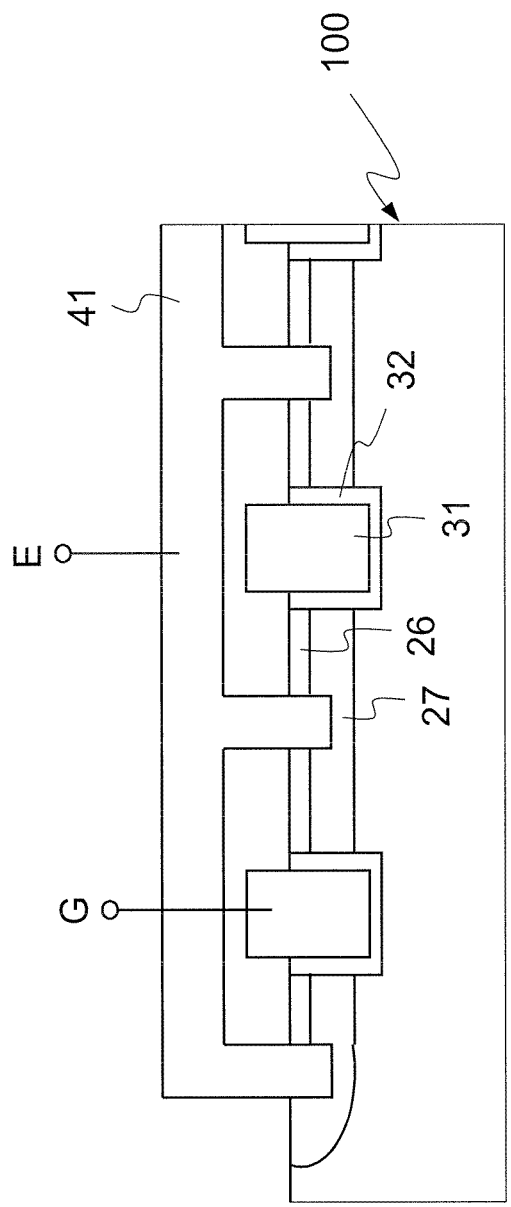
FIG. 2 illustrates one embodiment of a power IGBT having trench transistor cells.

It should be pointed out the provision of transistor cells having a planar gate electrode should be understood merely as an example, and that transistor cells having any other geometry of the gate electrode can, of course, be provided, such as e.g., trench transistor cells. FIG. 2 illustrates an example of such trench transistor cells on the basis of a cross section through the semiconductor body 100. In these trench transistor cells, the gate electrode 31 is arranged in trenches extending in a vertical direction of the semiconductor body 100 proceeding from the front side 101 through the source zone 26 and the body zone 27 right into the base zone 25, and is dielectrically insulated from the semiconductor body 100 by the gate dielectric 32.

Referring to FIG. 1, the transistor cell array ends, in a lateral direction of the semiconductor body 100, in the transition region between the inner zone 111 and the edge zone 112, and thus at a distance from the edge 103. In the example illustrated, the transistor cells are arranged in the region of the front side 101 of the semiconductor body 100 in the inner zone 111. The semiconductor component has an edge termination 50, which is arranged in the edge zone 112 and which is only illustrated schematically in FIG. 1. The edge termination can be any edge termination suitable for power semiconductor components.

Referring to FIG. 3, the edge termination 50 can include field rings 51, for example, which enclose the inner zone 111 and the transistor cell array in ring-shaped fashion in a lateral direction of the semiconductor body 100. The field rings 51 are doped semiconductor zones of the complementary conduction type with respect to the doping type of the base zone 25 and are arranged at a distance from one another in a direction of the edge 103, arranged in the region of the front side 101. Above the field rings 51, a passivation layer 53, such as an oxide layer, for example, can be applied to the front side 101 of the semiconductor body. Optionally, the edge termination 50 furthermore has field plates 54 which each make contact with one of the field rings 51 and which are arranged on or in the passivation layer 53. In the case of the edge termination illustrated in FIG. 3, such a field plate 54 is connected to each of the field rings 51. It goes without saying that there is also the possibility of providing such field plates only in association with individual field rings from among the field rings.

Optionally, the edge termination 50 additionally includes a channel stopper arranged in a lateral direction between the edge 103 and the field ring 51 lying closest to the edge 103. The channel stopper is a semiconductor zone of the same conduction type as the base zone 25, but is doped more highly. In accordance with the field rings 51, the channel stopper 52 completely surrounds the transistor cell array in a lateral direction of the semiconductor body.

A further embodiment of an edge termination 50 is illustrated in FIG. 4. This edge termination has a VLD zone (VLD—Variation of Lateral Doping), in the region of the front side 101. This is a semiconductor zone of the second conduction type, the doping concentration of which decreases in a direction of the edge 103 and/or the dimensions of which become smaller in a vertical direction with decreasing distance from the edge 103. This VLD zone completely surrounds the transistor cell array in a lateral direction of the semiconductor body 100. Optionally, above the VLD zone a passivation layer 53 is applied to the front side 101 of the semiconductor body. In accordance with the edge termination with field rings as explained with reference to FIG. 4, a channel stopper 52 is optionally present between the VLD zone 55 and the edge 103.

It should be pointed out that the edge terminations in accordance with FIGS. 3 and 4 are illustrated only to provide a better understanding, and that any further edge terminations suitable for power semiconductor components can, of course, be used in the power IGBT, such as e.g., JTE edge terminations (JTE=Junction Termination Extension) or in one embodiment bevelled edges.

Referring to FIG. 1, the IGBT has a second emitter zone 22, which is arranged at least in the inner zone 111 and which is adjacent to the second side 102 in the example illustrated. This further emitter zone, which is also referred to a drain zone or collector zone, is p-doped in the case of an n-channel IGBT and forms the p-type emitter of the component. Contact is made with this second emitter zone by a second connection electrode 42 or second emitter electrode, which is applied to the rear side 102 of the semiconductor body 100. In the case of an n-channel IGBT, the second emitter electrode is also referred to as collector K.

A field stop zone is present in the base zone 25 adjacent to the second emitter zone 22, the field stop zone having two differently doped field stop zone sections: a first field stop zone section 23 in the inner zone 111 and a second field stop zone section 24 in the edge zone 112. In the example illustrated, the first field stop zone section 23 is directly adjacent to the second emitter zone 22, but can also be arranged at a distance from the second emitter zone 22. In this case, however, the field stop zone is realized such that it lies significantly closer to the second emitter zone 22 than to the body zones 27 of the transistor cell array. In this case, the distance between the field stop zone 23, 24 and the body zones 27 is for example 5 to 10 times as large as the distance between the field stop zone 23, 24 and the second emitter zone 22.

The first field stop zone section 23 is more lightly doped than the second field stop zone section 24 or has a lower dopant dose than the second field stop zone section 24 in a vertical direction. In this case, the dopant dose (unit: $cm^{-2}$) corresponds to the spatial integral of the doping concentration (unit: $cm^{-3}$) in a vertical direction of the semiconductor body 100. The field stop zone 23, 24 can be effected by implantation of dopant atoms into a section of the semiconductor body 100 that already has a basic doping. In this case, the basic doping corresponds for example to the later doping of the base zone 25. The dopant dose of the field stop zone is then composed of the dopant dose already present and the implantation dose additionally introduced.

The dopant dose $D_{24}$ of the second field stop zone section 24 is for example between $1 \cdot 10^{12}$ $cm^{-2}$ and $5 \cdot 10^{13}$ $cm^{-2}$ or between $1 \cdot 10^{12}$ $cm^{-2}$ and $10^{13}$ $cm^{-2}$ and in particular between $2 \cdot 10^{12}$ $cm^{-2}$ and $10^{13}$ $cm^{-2}$. A ratio between the higher dopant dose $D_{24}$ of the second field stop zone section 24 and the lower dopant dose $D_{23}$ of the first field stop zone section 23 is for example between 1.5 and 5 ($D_{24}/D_{23}$=1.5 ... 5). The dopant dose of the first field stop zone section 23 is for example 0.3 times to 5 times the breakdown charge of the semiconductor material of the field stop zone or of the semiconductor body, such as e.g., silicon.

The dopant dose of the second emitter zone 22 in the region of the inner zone 111 is for example a few $10^{11}$ $cm^{-2}$ to $10^{15}$ $cm^{-2}$.

The doping concentrations of the second emitter zone 22 and of the first and second field stop zone sections 23, 24 are dependent on the dimensions of these semiconductor zones in a vertical direction. An edge concentration of the second emitter 22 is for example between $10^{16}$ cm$^{-3}$ and $10^{18}$ cm$^{-3}$. In the transition region with respect to the field stop zone 23, 24, an intersection point concentration is for example between $10^{14}$ cm$^{-3}$ and $10^{16}$ cm$^{-3}$.

The doping profiles in the base zone 25 and the first field stop zone section 23 and the second emitter zone 22 are illustrated schematically in the right-hand part of FIG. 1. The doping profiles in the base zone 25 and the more highly doped second field stop zone section 24 are illustrated schematically in the left-hand part of FIG. 1.

In the embodiment illustrated in FIG. 1, the second emitter zone 22 ends, in a lateral direction of the semiconductor body, in the transition region between the inner zone 111 and the edge zone 112, that is to say actually before the edge 103, and is thus essentially limited to the inner zone 111. As is illustrated in FIG. 1, the second emitter zone 22 can end in a lateral direction still within the inner zone 111, that is to say within the transistor cells. In this case, the inner zone is defined by the region of the semiconductor body 100 in which active transistor cells of the transistor cell array are present. A transistor cell such as is arranged at the edge of the cell array in FIG. 1 and which does not have a source zone is not such an active transistor cell.

The functioning of the power IGBT illustrated with reference to FIG. 1 is explained below. For explanation purposes it shall be assumed that the IGBT is an n-channel IGBT, that is to say that the base zone 25, the source zone 26 and the field stop zone 23, 24 are n-doped semiconductor zones, and that the body zone 27 and the second zone 22 are p-doped semiconductor zones. The explanation below is correspondingly also applicable to an IGBT having complementarily doped semiconductor zones, in which case the signs or polarities of the potentials and voltages mentioned below should be interchanged.

The IGBT is turned on if a positive voltage is present between collector K and emitter E and if a drive potential suitable for forming a conducting channel in the body zone 27 between the source zone 26 and the base zone 25 is present at the gate electrode 31. When the IGBT is driven in the on state, electrons are emitted from the source zone 26 via the channel in the body zone 27 and holes are emitted from the second emitter zone 22 into the base zone 25. The component is turned off if a positive voltage is present between collector K and emitter E but a drive potential suitable for forming a conducting channel in the body zone 27 is not present at the gate electrode 31. In this case, a space charge zone propagates proceeding from the pn junction between the body zone 27 and the base zone 25 in a vertical direction in the base zone 25. In this case, the static dielectric strength of the component is crucially determined by the dimensions of the base zone 25 in a vertical direction and the doping concentration thereof.

If the IGBT is turned off after a load current has previously flowed then at the beginning of the locking or turn-off operation the base zone 25 is still flooded with holes which, during a turn-off, can reduce the dielectric strength of the component relative to the static dielectric strength. In order to have the effect that the edge zone 112, when the power IGBT is turned on, is flooded to a lesser extent with free charge carriers, in one embodiment holes, like the inner zone 111, the emitter efficiency of the second emitter 22 is reduced in the region of the edge zone 112. Referring to FIG. 1, this can be achieved by the second emitter 22 being emitted in the region of the edge zone 112. As an alternative, there is the possibility of indeed providing the second emitter 22 in the region of the edge zone 112, but doping the second emitter more lightly in this region than in the region of the inner zone 111. FIG. 1 illustrates using a dashed line such a more lightly doped region of the second emitter zone 22, which is designed by $22_1$. The reduced flooding of the edge zone 112 with charge carriers when the component is turned on has the effect that during a turn-off of a load current flowing through that IGBT, the dynamic dielectric strength of the component is higher in the edge zone 112 than in the inner zone 111. If an avalanche breakdown occurs, then this occurs firstly in the inner zone 111, which has a larger area than the edge zone 112, and not in the edge zone 112 having a smaller area.

If an avalanche breakdown occurs in the component explained, then further charge carriers—in the example explained, in addition to p-type charge carriers or holes also n-type charge carriers or electrons—are generated in the base zone 25 by impact ionization and flow in a direction of the rear side 102. During an avalanche breakdown it is necessary to prevent a space charge zone associated with the flowing avalanche current from punching through as far as the rear side 102 of the semiconductor body 100. In the region of the inner zone 111, such a punch-through of the space charge zone is made more difficult by the second emitter zone 22 from which holes are emitted into the base zone 25 as soon as the space charge zone punches through as far as the emitter zone 22. These holes at least partly compensate for the electron current generated by impact ionization in the base zone 25. By contrast, in the region of the edge zone 112, in which no second emitter zone 22 or a more weakly doped second emitter zone $22_1$ is present, such a punch-through of the electric field to the rear side 102 is made more difficult or prevented by the more highly doped second field stop zone section 24, such that it is not possible that just low avalanche currents for the space charge zone to punch through as far as the rear side 102 and thus to a rear-side metallization layer, which would mean damage or destruction of the power IGBT. The component explained thus has both a high dynamic robustness and—in the event of an avalanche breakdown—a high avalanche current strength.

A possible method for producing the field stop zone having the two differently doped field stop zone sections 23, 24 and a second emitter zone 22 that is cut out in the region of the edge zone 112 is explained below with reference to 5a to 5c. These figures illustrate cross sections through the semiconductor body 100 during different method processes of the production method.

Figure 5A:
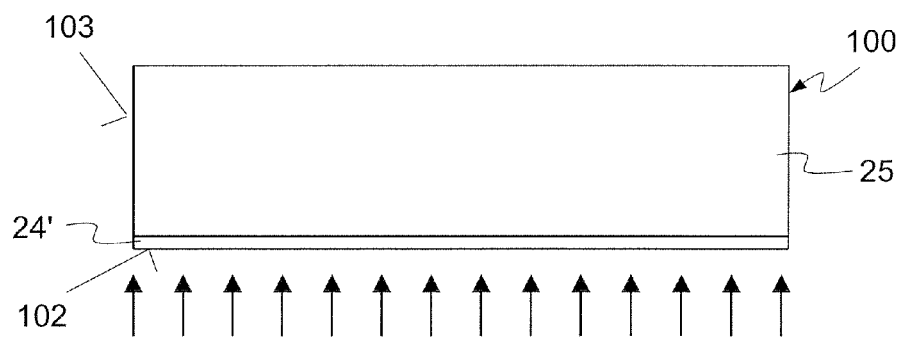
FIG. 5 illustrates one embodiment of a method for producing a field stop zone having two differently doped field stop zone sections of a power IGBT on the basis of cross sections through a semiconductor during different method processes.

During first method processes, which are illustrated in FIG. 5a, dopant atoms of the first conduction type are implanted into the semiconductor body 100 via one of the sides, the rear side 102 in the example. These doped dopant atoms form completely—or at least partly—the later more highly doped second field stop zone section 24. In FIG. 5a, 24' designates a region of the semiconductor body 100 into which the dopant atoms are implanted. The vertical dimensions of this region 24' are dependent on the implantation conditions, in one embodiment the implantation energy. The implantation energy is chosen for example such that the penetration depth of the implanted dopant atoms proceeding from the rear side 102 is below 200 nm, particularly below 120 nm. Dopant atoms used are, in one embodiment, those dopant atoms which have low energy levels which have a separation of at least 100 MeV from the conduction band edge of the semiconductor material of the semiconductor body. The semiconductor body 100 is composed of silicon, for example. Examples of n-type dopant atoms having low energy levels in comparison with silicon are selenium or sulfur. The use of such dopant atoms for realizing the more highly doped second field stop zone section 24 has the effect that when the component is turned off, the additional doping is almost completely available to prevent the punch-through of the space charge zone to the rear side 102 of the semiconductor body. When the component is turned on, the additional doping is not fully active, however on account of the low energy levels, such that the more highly doped second field stop zone section 24, when the component is turned on, does not act—or acts only to a slight extent—as an additional emitter, which would impair the dynamic properties of the component.

Figure 5B:
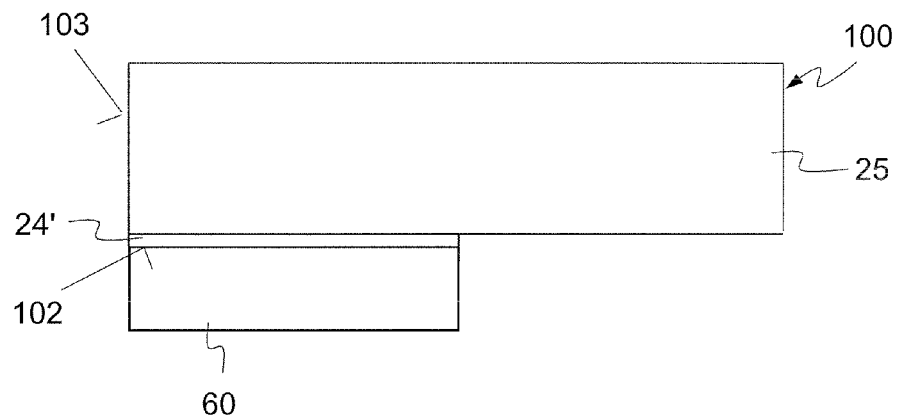

In a next method process, which is illustrated in FIG. 5B, the dopant atoms introduced previously are completely or at least partly removed again. For this purpose, referring to FIG. 6B, a mask 60 is produced on the rear side 102, which mask leaves free those regions in which the second emitter zone 22 and the more weakly doped first field stop zone section 23 are intended to be produced. Using the mask, the semiconductor body 100 is eroded proceeding from the rear side 102, to be precise until the previously implanted dopant atoms have been completely or at least partly removed again in this region. In the example illustrated in FIG. 5B, the previously introduced dopant atoms are completely removed.

Figure 5C:
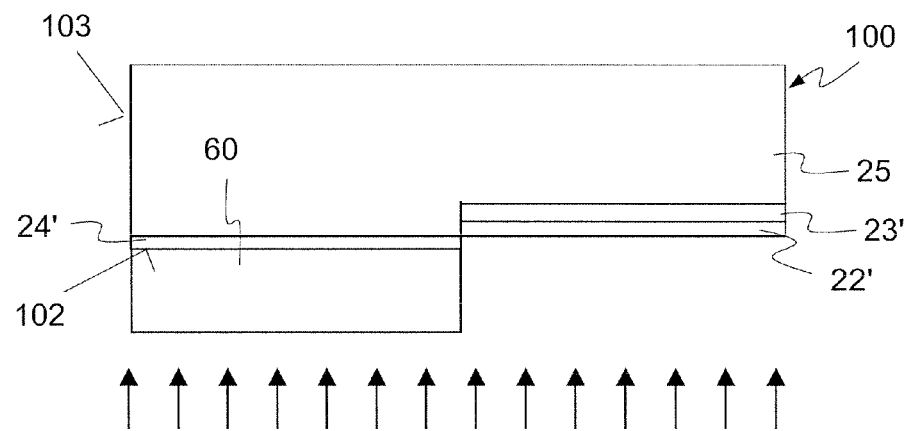

Referring to FIG. 5C, with the mask 60 being retained, two implantation methods are subsequently carried out: a first implantation method, by using which dopant atoms of the second conduction type are introduced in the region left free by the mask 60, the dopant atoms forming the later second emitter zone 22; and a second implantation method, by using which dopant atoms of the first conduction type are introduced in the region left free by the mask 60, the dopant atoms forming the later first field stop zone section 23. In this case, the dopant atoms of the first conduction type for the field top zone are implanted more deeply, than the dopant atoms of the second conduction type for the second emitter zone. The dopant atoms of the second implantation method are, for example, customary n-type dopant atoms, such as e.g., selenium and phosphorus.

In a manner not illustrated in greater detail, the mask 60 is subsequently removed and a thermal method is carried out, by using which the implanted dopant atoms are firstly activated and secondly indiffused into the semiconductor body 100 which ultimately leads to the component structure illustrated in FIG. 1. FIG. 1 does not illustrate a "step" in the region of the rear side which arises as a result of the partial erosion of the semiconductor body as explained with reference to FIG. 5B.

As an alternative, in the method processes explained with reference to FIG. 5C, there is the possibility of carrying out the first implantation method for introducing the dopant atoms of the second emitter zone 22, if the mask 60 has been applied to the rear side 102, but of removing the mask before carrying out the second implantation method. In this case, the dopant atoms of the first conduction type are also introduced into the edge zone 112 and intensify the doping of the second field stop zone section 24 there. In this case, the dopant dose of the second field stop zone section 24 results from the implantation dose of the implantation method explained with reference to FIG. 5A and the implantation dose of the second implantation method explained with reference to FIG. 5C (after removal of the mask).

The basic principle explained, namely of providing an increased field stop doping in the region of the edge zone of a semiconductor body of the power semiconductor component in order to increase the avalanche strength of the component, is not restricted to power IGBTs, but rather can also be applied to power diodes, for example.

Figure 6:
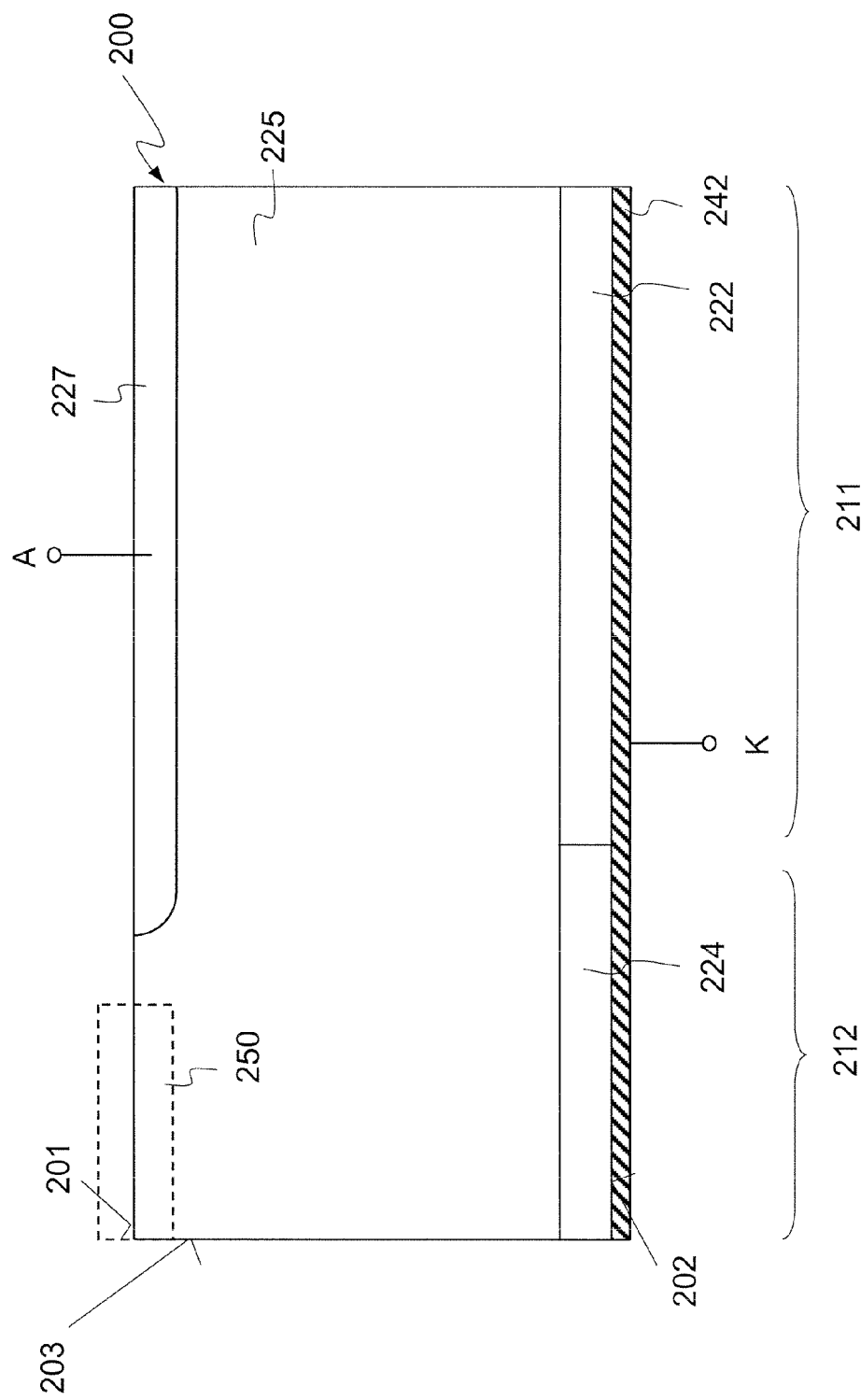
FIG. 6 illustrates one embodiment of a power diode on the basis of a cross section through a semiconductor body.

FIG. 6 illustrates one embodiment of such a power diode on the basis of a vertical cross section through a semiconductor body 200 of the diode. This semiconductor body 200 has a first side 201, which is referred to hereinafter as front side, a second side 202, which is referred to hereinafter as rear side, and an edge 203. The semiconductor body 200 has an edge zone 212, which adjoins the edge 203 in a lateral direction, and an inner zone 211 adjacent to the edge zone 212 in a lateral direction. An edge termination 250 is present in the region of the front side 201. The edge termination 250 can be realized in accordance with the edge termination 50 explained above for the power IGBT, such that in this regard reference is made to the explanations given above. The explanations given above for the edge zone 112 and the inner zone 111 of the power IGBT are correspondingly applicable to the edge zone 212 and the inner zone 211.

The power diode illustrated is a vertical power diode and has a first emitter zone 227, which is doped complementarily with respect to the base zone 225 and which is adjacent to the front side 201 of the semiconductor body 200. In a lateral direction of the semiconductor body 200, the first emitter zone 227 ends in the inner zone 211 or in a transition region between the inner zone 211 and the edge zone 212 and thus at a distance from the edge 203. The first emitter zone 227 is p-doped, for example, and in this case forms an anode zone of the diode, with which contact is made by an anode electrode A (illustrated schematically). The base zone 225 is arranged between the first emitter zone 227 and a second emitter zone 222, wherein, in the example illustrated, the second emitter zone 222 is adjacent to the rear side 202 of the semiconductor body 200 and contact is made with it there by a connection electrode 242. The second emitter zone 222 is of the same conduction type as the base zone 225, and thus doped complementarily with respect to the first emitter zone 227. In the case of an n-doped second emitter zone 222, the second connection electrode 242 is a cathode electrode K of the power diode. The second emitter zone 222 ends in the inner zone 211 or in a transition region between the inner zone 211 and the edge zone 212, and thus at a distance from the edge 203 in a lateral direction.

A doping concentration of the base zone 225 lies for example within the range of $10^{12}$ cm$^{-3}$ to $10^{14}$ cm$^{-3}$. The doping concentration of the second emitter zone 222 is significantly higher than that of the base zone 225. The dopant dose of the second emitter zone 222 lies for example in the region of $10^{15}$ cm$^{-2}$ given a vertical dimension of between 1 µm and 30 µm, which is equivalent to a doping edge concentration of between $3.3 \cdot 10^{17}$ cm$^{-3}$ and $1 \cdot 10^{20}$ cm$^{-3}$. In this case, the "doping edge concentration" is the doping at the edge of the doped region, that is to say where it is highest.

In the edge zone 212, the power diode referring to FIG. 7 has a field stop zone 224, which is doped more highly than the base zone 225 but more lightly than the second emitter zone 222. A dopant dose of the field stop zone 224 lies for example within the range of between $2 \cdot 10^{12}$ cm$^{-2}$ and $10^{13}$ cm$^{-2}$, and in one embodiment between $3 \cdot 10^{12}$ cm$^{-2}$ and $6 \cdot 10^{12}$ cm$^{-2}$, given vertical dimensions approximately identical to the emitter zone 222. In one embodiment, the dopant dose can be so high than not only a static but also a dynamic punch-through of the space charge zone is prevented. In this case, the dose lies above the breakdown charge, which is approximately $1.5^{10}$ cm$^{-2}$ for silicon.

The power diode illustrated is turned off if the pn junction between the first emitter zone 227 and the base zone 225 is reverse-biased. In accordance with the second field stop zone section 24 explained above for the power IGBT, the field stop zone 224 of the power diode has the effect that when an avalanche breakdown occurs, the space charge zone cannot punch through or at least cannot punch through at just very small avalanche currents as far as the rear side 202. A high dynamic robustness of this component is achieved by virtue of the fact that the second emitter zone 222 does not reach right into the edge zone 212 in a lateral direction or ends actually before the edge 203 in a lateral direction.

Figure 7A:
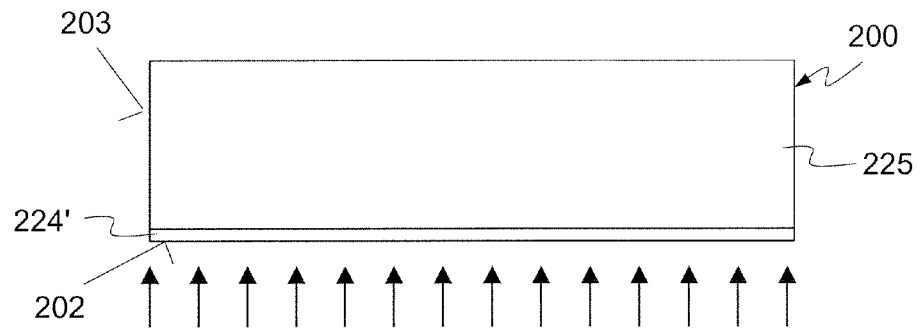
FIG. 7 illustrates one embodiment of a method for producing an emitter zone and a field stop zone of a power diode on the basis of cross sections through a semiconductor body during different method processes.

One embodiment of a method for producing the second emitter zone 222 and the field stop zone 224 for the power diode explained with reference to FIG. 6 is explained below with reference to FIG. 7. This method corresponds to the method already explained with reference to FIGS. 6A to 6C for producing a field stop zone having two differently doped field stop zone sections. Referring to FIG. 7A, this method involves firstly carrying out a whole-area implantation of dopant atoms of the first conduction type, which form the later field stop zone 224. In FIG. 7A, 224' designates a region of a semiconductor body 200 into which the dopant atoms are implanted.

Figure 7B:
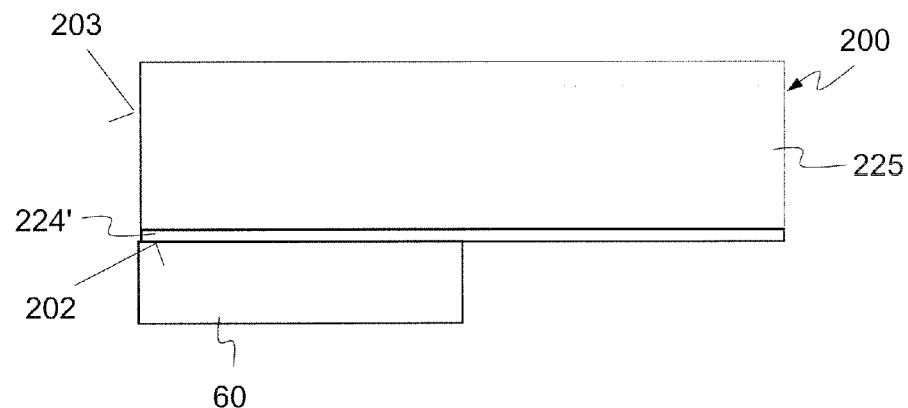

Referring to FIG. 7B, a mask 60 is subsequently applied to the rear side 202, which mask leaves free that region of the rear side 202 in which the second emitter zone 222 is produced later. The previously implanted dopant atoms can be partly removed after production of the mask (not illustrated). However, since these dopant atoms of the same conduction type as the dopant atoms of the second emitter zone 222, these already introduced dopant atoms can also remain after production of the mask 60.

Figure 7C:
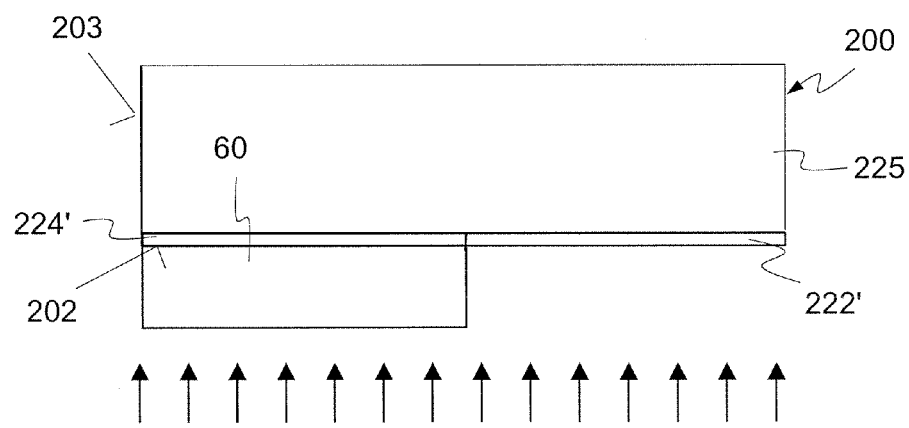

Referring to FIG. 7C, further dopant atoms of the first conduction type are subsequently implanted using the mask 60, the dopant atoms forming the later second emitter zone 222. In FIG. 7C, 222' designates a region of the semiconductor body into which these dopant atoms of the first conduction type are implanted. In this case, the implantation dose of the implantation method for producing the field stop zone 224 as explained with reference to FIG. 7A is lower than the implantation dose of the method explained with reference to FIG. 7C since a lower doping is intended to be achieved for the field stop zone 224 and for the emitter zone. If the dopant atoms introduced into the first implantation method remain completely in the semiconductor body, then the doping of the emitter zone 222 is composed of the dopant atoms introduced by the two implantation methods.

In a manner not illustrated in greater detail there is also the possibility of modifying the method in accordance with FIGS. 7A to 7C such that firstly the dopant atoms which form the second emitter zone are implanted, wherein the mask in this case is produced in such a way that it covers those sections of the rearside 202 in which the field stop zone is intended to be produced. In this case, the dopant atoms for producing the field stop zone are implanted after removal of the mask, wherein in this case the dopant atoms are implanted over the whole area via the rear side 202 at the semiconductor body. In this method, the field stop zone 24 results from the second implantation method, while the second emitter zone in this method results from both implantation methods.

In accordance with the explanations concerning the power IGBT, the dopant atoms of the field stop zone 24 are in one embodiment dopant atoms having low energy levels, such as e.g., selenium or sulfur.

Finally, it should be pointed out that method or circuit features that were explained only in association with one example can be combined with method or circuit features from other examples even if this was not explicitly explained above. Thus, in particular features which are represented in one of the claims below can be combined with features of any other claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A method for producing a semiconductor component structure in a semiconductor body having a first and a second side, wherein the method comprises producing two differently doped semiconductor zones of the same conduction type, comprising:
   carrying out a first implantation, in the course of which dopant atoms of a first conduction type are implanted into the semiconductor body via one of the sides over the whole area;
   producing a mask on the one side, which partly leaves free the one side;
   removing at least a portion of the implanted dopant atoms by eroding the semiconductor body proceeding from the one of the sides in the region left free by the mask;
   removing the mask, wherein a second implantation is carried out before or after the mask has been removed, in the course of which implantation dopant atoms of the first conduction type are implanted into the semiconductor body via the one of the sides.

2. The method of claim 1, comprising:
   producing an emitter zone of the second conduction type; and
   carrying out a third implantation before removing the mask; and,
   using the mask, implanting dopant atoms of the second conduction type into the semiconductor body via the one side.

3. The method of claim 1, comprising effecting removing at least a portion of the implanted dopant atoms of the first conduction type using the implantation mask.

4. The method of claim 1, wherein the dopant atoms introduced by means of the second implantation are selenium atoms or sulfur atoms.

5. A method for producing a semiconductor component structure in a semiconductor body having a first and a second side, comprising:
   producing two differently doped semiconductor zones of the same conduction type;
   carrying out a first implantation, implanting dopant atoms of a first conduction type into the semiconductor body via one of the sides over the whole area;
   producing a mask on the one side, partly leaving free the one side;
   carrying out a second implantation, implanting dopant atoms of the first conduction type into the region left free by the mask proceeding from the one of the sides; and
   wherein after producing the mask and before carrying out the second implantation method, the dopant atoms introduced by the first implantation method in the regions left free by the mask are partly or completely removed.

6. A method comprising:
   carrying out a first implantation, including implanting dopant atoms of a first conduction type into a semiconductor body via a first side,
   producing a mask on the first side, leaving a region of the first side free;
   removing at least a portion of the implanted dopant atoms by eroding the semiconductor body proceeding from the region left free by the mask;

removing the mask, wherein a second implantation is carried out before or after the mask has been removed, including implanting dopant atoms of the first conduction type are implanted into the semiconductor body via the first side or a second side.

7. The method of claim 6, comprising:

producing an emitter zone of the second conduction type; and carrying out a third implantation before removing the mask; and, using the mask, implanting dopant atoms of the second conduction type into the semiconductor body via the first side.

8. The method of claim 7, comprising effecting removing at least a portion of the implanted dopant atoms of the first conduction type using the implantation mask.

9. The method of claim 8, wherein the dopant atoms introduced by the second implantation are selenium atoms or sulfur atoms.

* * * * *